(12) United States Patent
Lim et al.

(10) Patent No.: US 11,521,859 B2
(45) Date of Patent: Dec. 6, 2022

(54) NON-PHOSPHORIC ACID-BASED SILICON NITRIDE FILM ETCHING COMPOSITION AND ETCHING METHOD USING THE SAME

(71) Applicant: INDUSTRY-ACADEMIC COOPERATION FOUNDATION, YONSEI UNIVERSITY, Seoul (KR)

(72) Inventors: Sangwoo Lim, Seoul (KR); Changjin Son, Seoul (KR)

(73) Assignee: INDUSTRY-ACADEMIC COOPERATION FOUNDATION, YONSEI UNIVERSITY, Seoul (KR)

(*) Notice: Subject to any disclaimer, the term of this patent is extended or adjusted under 35 U.S.C. 154(b) by 0 days.

(21) Appl. No.: 17/305,034

(22) Filed: Jun. 29, 2021

(65) Prior Publication Data
US 2022/0235267 A1    Jul. 28, 2022

(30) Foreign Application Priority Data

Jan. 26, 2021    (KR) .................. 10-2021-0010937
Mar. 30, 2021    (KR) .................. 10-2021-0040860

(51) Int. Cl.
| | | |
|---|---|---|
| H01L 21/311 | (2006.01) | |
| C09K 13/08 | (2006.01) | |
| H01L 21/02 | (2006.01) | |

(52) U.S. Cl.
CPC ........ *H01L 21/31111* (2013.01); *C09K 13/08* (2013.01); *H01L 21/0217* (2013.01); *H01L 21/311* (2013.01); *H01L 21/31105* (2013.01)

(58) Field of Classification Search
None
See application file for complete search history.

(56) References Cited

U.S. PATENT DOCUMENTS

2017/0287725 A1*    10/2017    Rotondaro ........ H01L 21/31111
2021/0108140 A1*    4/2021    Kim ........................ C09K 13/08

FOREIGN PATENT DOCUMENTS

| JP | 2018-207108 A | 12/2018 |
|---|---|---|
| JP | 2020-096162 A | 6/2020 |
| KR | 10-2017-0030774 A | 3/2017 |
| KR | 10-2018-0072688 A | 6/2018 |
| KR | 10-2018-0084210 A | 7/2018 |
| KR | 10-2019-0080962 A | 7/2019 |
| KR | 10-1977043 B1 | 8/2019 |

OTHER PUBLICATIONS

Notice of Allowance in Korean Patent Application No. 10-2021-0040860 dated Aug. 3, 2021 in 2 pages.

* cited by examiner

*Primary Examiner* — Jiong-Ping Lu
(74) *Attorney, Agent, or Firm* — Knobbe, Martens, Olson & Bear LLP (57) ABSTRACT

A non-phosphoric acid-based silicon nitride film etching composition includes 5 to 50 wt % of an organic acid-based chelating agent including an organic phosphonic acid group, a carboxylic acid group, or a combination thereof, based on a total weight of the etching composition. The etching composition for pressurization suppresses etching a silicon oxide film and selectively etches a silicon nitride film in a vertically laminated structure in which both the silicon nitride film and the silicon oxide film are exposed to a surface or the silicon nitride film and the silicon oxide film are alternately laminated.

13 Claims, 7 Drawing Sheets

FIG. 1

Prior Art

NON-PHOSPHORIC ACID-BASED SILICON NITRIDE FILM ETCHING COMPOSITION AND ETCHING METHOD USING THE SAME

CROSS-REFERENCE TO RELATED APPLICATIONS

This application claims priority under 35 U.S.C. § 119 to Korean Patent Application Nos. 10-2021-0010937 and 10-2021-0040860, filed on Jan. 26, 2021 and Mar. 30, 2021, respectively, in the Korean Intellectual Property Office, the disclosures of which are incorporated herein by reference in their entirety.

TECHNICAL FIELD

The present disclosure relates to a non-phosphoric acid-based silicon nitride film etching composition and an etching method using the same.

BACKGROUND

A silicon oxide film ($SiO_x$) and a silicon nitride film ($SiN_x$) are used as a representative insulating film in a semiconductor manufacturing process, and each of these is used alone so that both are exposed to a surface, or one or more layers of silicon oxide films and one or more layers of silicon nitride films are alternately laminated. Recently, in the manufacture of memory semiconductors having a three-dimensional vertical NAND (V-NAND), a structure in which a silicon nitride film and a silicon oxide film are alternately laminated is used. Thus, an etching composition capable of implementing effective etchability even in a multilayer vertically laminated structure as such and an etching process thereof are demanded.

KR 10-2017-0030774 A and KR 10-1977043 B1 disclose the related technology.

The disclosure of this section is to provide background information relating to the present disclosure. Applicant does not admit that any information contained in this section constitutes prior art.

SUMMARY

The present disclosure is directed to providing an etching composition which suppresses etching a silicon oxide film and selectively etches a silicon nitride film in a vertically laminated structure in which both the silicon nitride film and the silicon oxide film are exposed to a surface or the silicon nitride film and the silicon oxide film are alternately laminated and an etching method using the same.

The present disclosure is directed to providing a non-phosphoric acid-based etching composition for pressurization which may selectively etch a silicon nitride film rather than a silicon oxide film, in etching an insulation film composed of a silicon oxide film and a silicon nitride film. In particular, a non-phosphoric acid-based etching composition which may exert effective etchability even in a V-NAND structure is provided.

Specifically, the present disclosure provides an etching composition for pressurization, for selectively etching a silicon nitride film, which may stably implement etchability in a vertically laminated structure in which the silicon nitride film and the silicon oxide film are alternately laminated as well as in a structure in which both the silicon nitride film and the silicon oxide film are exposed to a surface.

Specifically, the present disclosure provides an etching composition for pressurization which may suppress occurrence of abnormal growth of a silicon oxide film during an etching process.

The present disclosure invention is further directed to providing a method of selectively etching a silicon nitride film using the etching composition for pressurization described above and a method of manufacturing a semiconductor device.

In one general aspect, a non-phosphoric acid-based etching composition for pressurization is provided. Specifically, the non-phosphoric acid-based etching composition for pressurization may be an etching composition for pressurization including 5 to 50 wt % of an organic acid-based chelating agent including an organic phosphonic acid group, a carboxylic acid group, or a combination thereof, based on a total weight.

In another general aspect, a method of manufacturing a semiconductor device using the etching composition described above includes: selectively etching a silicon nitride film rather than a silicon oxide film under a pressurization condition, using the etching composition described above.

Other features and aspects will be apparent from the following detailed description, the drawings, and the claims.

DETAILED DESCRIPTION OF EMBODIMENTS

Hereinafter, embodiments of the present invention will be described in detail. Technical terms and scientific terms used herein have the general meaning understood by those skilled in the art to which the present invention pertains unless otherwise defined, and a description for the known function and configuration obscuring the present invention will be omitted in the following description.

In addition, a singular form used in the present specification may be intended to also include a plural form, unless otherwise indicated in the context.

In addition, units used in the present specification without particular mention are based on weights, and as an example, a unit of % or ratio refers to a wt % or a weight ratio, and the wt % refers to a wt % of any one component in a total composition occupied in the composition, unless otherwise defined.

In addition, a numerical range used in the present specification includes all values within the range including the lower limit and the upper limit, increments logically derived in a form and span in a defined range, all double limited values, and all possible combinations of the upper limit and the lower limit in the numerical range defined in different forms. As an example, when it is defined that a numerical value is 100 to 10,000, specifically 500 to 5,000, it should be interpreted as being that a numerical range of 500 to 10,000 or 100 to 5,000 is also described in the specification of the present disclosure. Unless otherwise defined in the specification of the present disclosure, values which may be outside a numerical range due to experimental error or rounding of a value are also included in the defined numerical range.

The term "comprise" in the present specification is an open-ended description having a meaning equivalent to the expression such as "provided", "contain", "have", or "is/are characterized", and does not exclude elements, materials or processes which are not further listed.

The term "substantially" in the present specification means that other elements, materials, or processes which are not listed together with specified elements, materials, or processes may be present in an amount which does not have an unacceptable significant influence on at least one basic and novel technical idea of the present invention.

The term "etching selection ratio ($E_{SiNx}/E_{SiO2}$)" in the present specification refers to a ratio of a silicon nitride film etching rate ($E_{SiNx}$) to a silicon oxide film etching rate ($E_{SiO2}$). In addition, when the etching rate of a silicon oxide film is close to 0 or the numerical value of the etching selection ratio is large, it means that the silicon nitride film may be selectively etched.

The term "$C_A$-$C_B$" in the present specification refers to "having A or more and B or less carbon atoms" and the term "A to B" in the present specification refers to "A or more and B or less".

The term "alkyl" in the present specification refers to a linear or branched saturated monovalent hydrocarbon group consisting only of carbon and hydrogen atoms, and specifically, includes methyl, ethyl, n-propyl, isopropyl, n-butyl, isobutyl, t-butyl, n-pentyl, n-hexyl, and the like, but is not limited thereto. In addition, "alkoxy" refers to "*—O-alkyl", in which alkyl is as described above.

The term "alkylamino" in the present specification refers to "*—$NR^{a1}R^{a2}$", in which one of $R^{a1}$ and $R^{a2}$ may be alkyl and the other one may be hydrogen or alkyl. That is, the alkylamino may be a term including monoalkylamino or dialkylamino, in which alkyl is as defined in each chemical formula.

The term "hydroxy" in the present specification refers to "*—OH".

Figure 1:
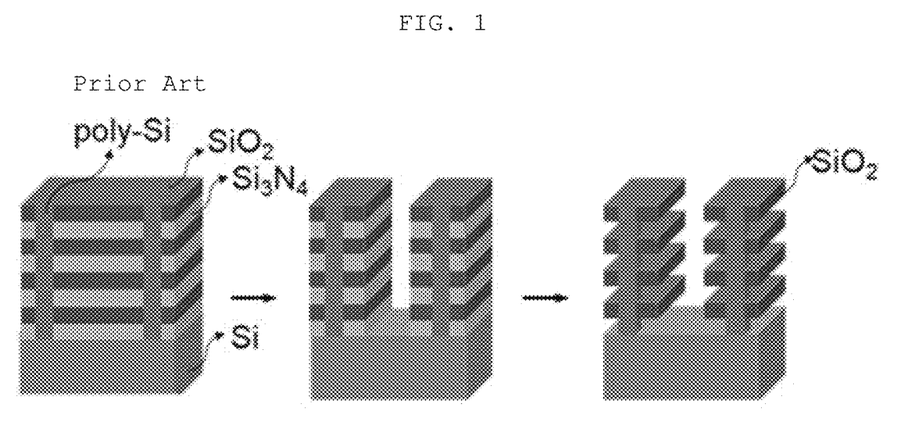
FIG. 1 is a drawing illustrating a vertically laminated structure of a silicon nitride film and a silicon oxide film.

Recently, in the manufacture of memory semiconductors having a three-dimensional vertical NAND (V-NAND), a structure in which a silicon nitride film and a silicon oxide film are alternately laminated is used, as shown in the following FIG. 1. Thus, an etching composition capable of implementing effective etchability even in a multilayer vertically laminated structure as such and an etching process thereof are demanded.

An example process is to add an additive to a phosphoric acid at a high temperature to etch a silicon nitride film, but the phosphoric acid at a high temperature has a short chemical liquid replacement cycle. In addition, in order to prevent an etch rate from being decreased and selectivity to a silicon nitride film from being changed, pure water (deionized water) may need to be supplied. However, even if an amount of pure water to be supplied is slightly changed, removal of a silicon nitride film fails. In addition, an excessive consumption and a handling risk of phosphoric acid may be raised.

Considering the foregoing, development of an etching composition for increasing mass production of semiconductors, which uses no or less phosphoric acid, maybe needed. As another example of the etching composition as such, a non-phosphoric acid-based silicon nitride film etching composition including an inorganic-based fluorine compound, a silicon-based compound, a polar organic solvent, and water may be provided, but an etching rate thereof is only up to 32.5 Å/min in a flat plate structure and possibility of abnormal growth of a silicon oxide is very high, so that it is difficult to apply the composition to a V-NAND structure.

In addition, as still another example, a non-phosphoric acid-based silicon nitride film etching composition including an acid compound, a base compound, a fluorine compound, and a silicon-based compound without adding a phosphoric acid may be provided. However, development of a wet etching composition having a new composition is still needed.

While the present inventors intensively studied a non-phosphoric acid-based etching composition which uses substantially no phosphoric acid, they devised a process capable of selectively etching a silicon nitride film with only a mixed composition of a predetermined chelating agent and water. Specifically, since the etching composition according to embodiments of the present invention uses water as a solvent, it is very safe, and may implement a high selection ratio of a silicon nitride film to a silicon oxide film without a side reaction though the process is performed under high temperature and pressurization conditions. Furthermore, the etching composition according to embodiments of the present invention shows remarkableness of the effect when the etching composition is applied to a vertically laminated structure having a silicon oxide film and a silicon nitride film as a unit layer. Thus, the present inventors suggests a non-phosphoric acid-based etching composition having a new composition according to embodiments of the present invention.

Hereinafter, embodiments of the present invention will be described in detail.

As described above, embodiments of the present invention provide an etching composition having a new composition which may selectively etch a silicon nitride film rather than a silicon oxide film. That is, the etching composition according to embodiments of the present invention may be an etching composition for a silicon nitride film and a non-phosphoric acid-based etching composition including no phosphoric acid.

Specifically, the etching composition according to embodiments of the present invention is an etching composition for pressurization including 5 to 50 wt % of an organic acid-based chelating agent including an organic phosphonic acid group, a carboxylic acid group, or a combination thereof, based on a total weight of the etching composition.

The etching composition for pressurization according to embodiments of the present invention may implement excellent etchability to a target subject to be etched, with only a simple composition as described above. However, when only the composition or the pressurization method according to embodiments of the present invention is satisfied, it is impossible to implement the same effect. For example, when only the etching composition according to embodiments of the present invention is satisfied, the composition is hardened on a surface of the subject to be etched during the process to lose a function as the etching composition or promote abnormal growth of a silicon oxide film.

The subject to be etched of the etching composition for pressurization according to an example embodiment of the present invention may be a wafer in which both the silicon oxide film and the silicon nitride film are exposed to the surface; a wafer having a lamination structure having the silicon oxide film and the silicon nitride film as a unit layer; or the like, and may embrace all forms of being laminated in various embodiments. In addition, the unit layer may be a layer in which the silicon nitride film is laminated on the silicon oxide film or a layer in which the silicon oxide film is laminated on the silicon nitride film.

In the etching composition for pressurization according to an example embodiment of the present invention, a first embodiment of the organic acid-based chelating agent may be one or two or more selected from citric acid, tartaric acid, ethylenediaminetetraacetic acid, diethylenetriaminepentaacetic acid, N-(hydroxyethyl)ethylenediaminetriacetic acid, nitrilotriacetic acid, ethylenediaminedisuccinic acid, and salts thereof.

In the etching composition for pressurization according to an example embodiment of the present invention, a second embodiment of the organic acid-based chelating agent may be one or two or more selected from ethylenediaminetetra(methylenephosphonic acid), aminotris(methylenephosphonic acid), diethylenetriamine-penta(methylenephosphonic acid), etidronic acid, and salts thereof.

In the etching composition for pressurization according to an example embodiment of the present invention, a third embodiment of the organic acid-based chelating agent may be one or two or more selected from phosphonobutane-3-carboxylic acid, N-(phosphonomethyl)iminodiacetic acid, 2-carboxyethylphosphonic acid, 2-hydroxyphosphonoacetic acid, and salts thereof.

In the etching composition for pressurization according to an example embodiment of the present invention, a fourth embodiment of the organic acid-based chelating agent may be a mixture of two or more selected from the first embodiment, the second embodiment, and the third embodiment described above.

In the etching composition for pressurization according to an example embodiment of the present invention, the organic acid-based chelating agent may be included at 45 wt % or less, 40 wt % or less, 35 wt % or less, or 15 to 30 wt %, based on the total weight of the composition.

As an example, when the organic acid-based chelating agent is the fourth embodiment, the organic acid-based chelating agent may be a mixture of 100 to 500 parts by weight, 100 to 300 parts by weight, or 100 to 200 parts by weight of the second or third embodiment, based on 100 parts by weight of the first embodiment.

A balance of the etching composition for pressurization according to an example embodiment is water. Water is not particularly limited, but specifically, may be distilled water or deionized water (DIW), and more specifically, may be deionized water for a semiconductor process having a resistivity value of 18.25 MΩ·cm or more.

In addition, the etching composition for pressurization according to an example embodiment of the present invention may be used at 2 to 220 atm. When the pressurization condition as such is satisfied, a silicon nitride film may be stably etched without use of a phosphoric acid and resolve trade-off between an etching rate and an etching selection ratio for a silicon nitride film to implement both in balance.

In addition, the etching composition for pressurization according to an example embodiment of the present invention has a viscosity of more than 0 and 0.030 cP, which is 1000 times lower than the viscosity of an example 85 wt % phosphoric acid. Thus, it is easy to diffuse and penetrate the etching composition as compared with the example 85 wt % phosphoric acid process in etching a semiconductor structure having a high aspect ratio.

The etching composition for pressurization according to an example embodiment of the present invention may satisfy the following (A) to (C). Here, the following etching characteristics are the effects in a single layer.

Figure 13:
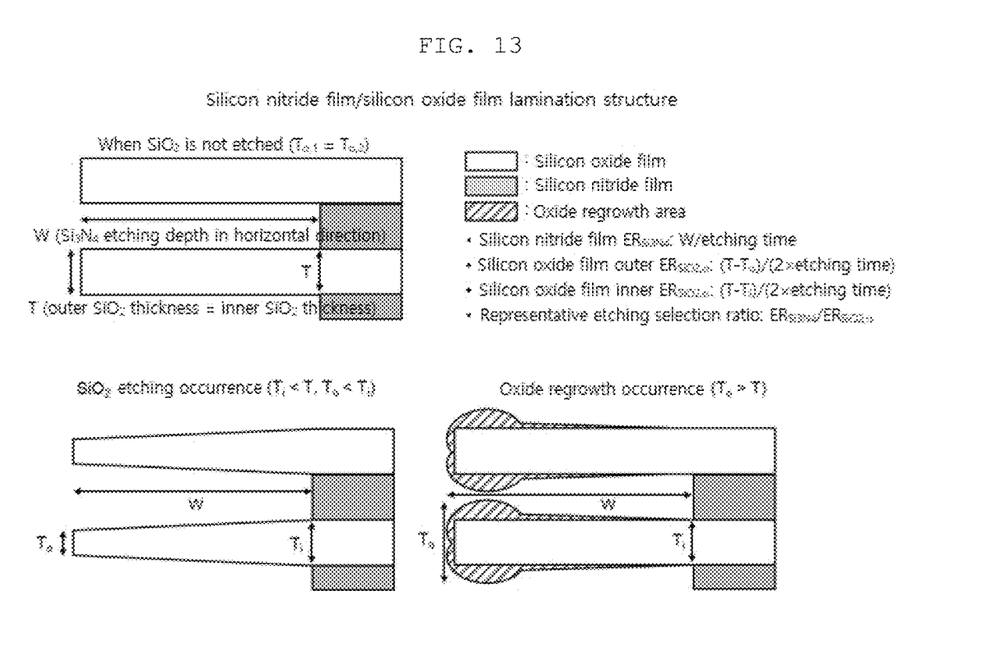
FIG. 13 illustrates a method of determining an etching rate and an etching selection ratio in the vertically laminated structure according to embodiments of the present invention.

In addition, the etching composition for pressurization according to an example embodiment of the present invention may further satisfy the following (D). Here, the following etching characteristics are the effects in a vertically laminated structure:

(A) including 10 to 50 wt % of the organic acid-based chelating agent and a balance of water, (B) having an etching rate of the silicon nitride film of 35 Å/min or more, (C) having an etching selection ratio of the silicon nitride film to the silicon oxide film of 40 or more, and (D) having an outer thickness ($T_0$) relative to an inner thickness ($T_i$) of the silicon oxide film satisfying the following Equation 1, in a vertically laminated structure having the silicon oxide film and the silicon nitride film as a unit layer. Referring to the following FIG. 13, the inner thickness ($T_i$) of the silicon oxide film refers to a thickness of the silicon oxide film measured at the end in an etching depth direction in which the silicon nitride film is etched, and the outer thickness ($T_0$) of the silicon oxide film refers to a thickness of the silicon oxide film measured at the end facing in an opposite direction to $T_i$.

$$1.0 \geq T_0/T_i \geq 0.89 \quad \text{[Equation 1]}$$

As an example, the etching composition for pressurization may have an etching selection ratio of 45 or more or 45 to 200.

As an example, when the etching composition for pressurization includes the organic acid-based chelating agent of the first embodiment, etching rate suppression ability for the silicon oxide film among the etching characteristics in the vertically laminated structure may be advantageous.

As an example, when the etching composition for pressurization includes the organic acid-based chelating agent of the second embodiment and the third embodiment, the etching selection ratio among the etching characteristics in the vertically laminated structure may be advantageous.

As an example, when the etching composition for pressurization includes an etidronic acid as the organic acid-based chelating agent, the etching rate and the selection ratio for the silicon nitride film may be advantageous. For example, the etching rate for the silicon nitride film may be 50 Å/min or more, 80 Å/min or more, or in a range of 100 to 700 Å/min. For example, the selection ratio of the silicon nitride film to the silicon oxide film may be 45 or more or 60 to 200.

The etching composition for pressurization according to an example embodiment of the present invention may further include an additive selected from hydroxides, fluorine-based compounds, and the like.

The hydroxide is not particularly limited as long as it may provide a hydroxide ion ($OH^-$), and as a non-limiting example thereof may be one or two or more selected from $NH_4OH$, $NaOH$, $KOH$, $Be(OH)_2$, $Mg(OH)_2$, $Ca(OH)_2$, and the like.

As an example, an amount of the hydroxide used may be 0.001 to 10 wt %, 0.005 to 1 wt %, or 0.01 to 0.5 wt %, based on the total weight of the composition.

The fluorine-based compound is not particularly limited as long as it may provide a fluorine ion ($F^-$), and a non-limiting example thereof may be one or two or more selected from $HF$, $NH_4F$, $NH_4HF_2$, $H_2SiF_6$, and the like.

As an example, an amount of the fluorine-based compound used may be 0.001 to 0.5 wt %, 0.001 to 0.1 wt %, or 0.005 to 0.05 wt %, based on the total weight of the composition.

The etching composition for pressurization according to an example embodiment of the present invention may further include an inorganic acid selected from hydrochloric acid, nitric acid, sulfuric acid, acetic acid, and boric acid; and a silicon-based compound represented by the following Chemical Formula 1, while simultaneously including the additive selected from hydroxides, fluorine-based compounds, and the like, in terms of the etching rate and the selection ratio for the silicon nitride film.

[Chemical Formula 1]

wherein $R_1$ to $R_4$ are independently of one another hydrogen, hydroxy, C1-C20 alkyl, C1-C20 aminoalkyl, C1-C20 alkoxy, C1-C20 acetyloxy, or C1-C20 haloalkylacetyloxy.

The silicon-based compound may be the compound of Chemical Formula 1 wherein at least one of $R_1$ to $R_4$ is hydrogen, hydroxy, or C1-C20 alkoxy, and the remaining is hydrogen, hydroxy, C1-C20 alkyl, C1-C20 aminoalkyl, C1-C20 alkoxy, C1-C20 acetyloxy, or C1-C20 haloalkylacetyloxy.

A non-limiting example of the silicon-based compound may be one or a mixture of two or more selected from silicic acid, tetraethyl orthosilicate, trimethoxymethylsilane, and the like, and preferably may include silicic acid or trimethoxymethylsilane.

As an example, an amount of the silicon-based compound used may be 0.01 to 1.0 wt %, 0.05 to 0.5 wt %, or 0.05 to 0.3 wt % based on the total weight of the composition.

As an example, an amount of the inorganic acid used may be 0.0001 to 0.1 wt %, 0.001 to 0.05 wt %, or 0.005 to 0.01 wt %, based on the total weight of the composition.

The etching composition for pressurization according to an example embodiment of the present invention further includes the additive combination described above, thereby satisfying the following (A') to (D'):

(A') including 10 to 50 wt % of the organic acid-based chelating agent and a balance of water, (B') having the etching rate of the silicon nitride film of 40 Å/min or more, (C') having the etching selection ratio of the silicon nitride film to the silicon oxide film of 400 or more, and (D') having the outer thickness ($T'_o$) relative to the inner thickness ($T'_i$) of the silicon oxide film satisfying the following Equation 2, in a vertically laminated structure having the silicon oxide film and the silicon nitride film as a unit layer:

$$1.0 \geq T'_o/T'_i \geq 0.89. \quad \text{[Equation 2]}$$

In addition, the etching composition for pressurization according to an example embodiment of the present invention may further satisfy the following (E):

(E) having a representative etching selection ratio ($ER_{Si3N4}/ER_{SiO2,o}$) satisfying the following Equation 3, in a vertically laminated structure having the silicon oxide film and the silicon nitride film as a unit layer. Herein, the following Equation 3 is a resulting value confirmed by the method illustrated in FIG. 13:

$$ER_{Si3N4}/ER_{SiO2,o} \geq 90. \quad \text{[Equation 3]}$$

The etching composition for pressurization according to an example embodiment of the present invention may provide more advantage to the etching characteristics in a vertically laminated structure than the etching characteristics in a single layer.

As an example, the etching composition for pressurization shows a representative etching selection ratio in a vertically laminated structure which is improved by at least 1.4 times the etching selection ratio in a single layer.

As an example, the etching composition for pressurization may satisfy Equation 1 of (D) or Equation 2 of (D') of 0.9 or more, or satisfy 0.91 to 0.99.

As an example, the etching composition for pressurization may satisfy Equation 3 of (E) of 95 or more, 150 or more, or 180 to 1,000.

In addition, the etching composition for pressurization according to an example embodiment of the present invention may be prepared by a commonly known method, and is not limited as long as it has a purity for a semiconductor process.

In addition, embodiments of the present invention provide an etching method of selectively etching a silicon nitride film rather than a silicon oxide film using the etching composition described above, and a method of manufacturing a semiconductor device including the etching method.

The etching method according to an example embodiment of the present invention may include, specifically, introducing a wafer including the etching composition for pressurization of embodiments of the present invention and a subject to be etched to a reactor; and pressurizing and heating the reactor at 2 to 220 atm to etch the wafer.

In the step, high temperature etching may be performed by heating at 100° C. or higher in a state of maintaining a pressurized state in a range of 2 to 220 atm.

In addition, in the step, the high temperature etching may be performed by heating to 100° C. or higher to form a pressurized state in a range of 2 to 220 atm.

In the etching method according to an example embodiment of the present invention, a specific range of the pressurization condition may be 2 to 150 atm, 3 to 100 atm, 3 to 50 atm, 3 to 20 atm, or 5 to 10 atm. When the pressurization conditions as such are satisfied, synergy may be imparted to etchability in a vertically laminated structure. Here, etchability to which synergy is imparted has meaning in terms of exceeding an increase level of a simple quantitative effect due to application of pressurization conditions.

In the etching method according to an example embodiment of the present invention, the heating may be performed at a process temperature of 100 to 500° C., more specifically 100 to 300° C., and an appropriate temperature may be changed, if necessary, considering other processes and other factors, of course.

The silicon nitride film may include a SiN film, SiON film, a doped SiN film, and the like, and means film quality mainly used as an insulating film upon formation of a gate electrode and the like, but may be used without limitation as long as it belongs to a technical field having a purpose of selectively etching the silicon nitride film rather than the silicon oxide film.

In addition, the silicon oxide film is not limited as long as it is a commonly used silicon oxide film in the art, and as an example, may be at least one or more films selected from a spin on dielectric (SOD) film, a high density plasma (HDP) film, a thermal oxide film, a borophosphate silicate glass (BPSG) film, a phospho silicate glass (PSG) film, a borosilicate glass (BSG) film, a polysilazane (PSZ) film, fluorinated silicate glass (FSG) film, a low pressure tetraethyl orthosilicate (LP-TEOS) film, a plasma enhanced tetraethyl orthosilicate (PETEOS) film, a high temperature oxide (HTO) film, a medium temperature oxide (MTO) film, an undoped silicate glass (USG) film, a spin on glass (SOG) film, an advanced planarization layer (APL) film, an atomic layer deposition (ALD) film, a plasma enhanced (PE)-oxide film, and $O_3$-tetraethyl orthosilicate (TEOS), and the like. However, these are only a specific example, and the present invention is not limited thereto.

In the etching method according to an example embodiment of the present invention, the wafer may be used without a limitation as long as it is a commonly used method, and for example, silicon, quartz, glass, a silicon wafer, a polymer, a metal, a metal oxide, and the like may be used, but is not limited thereto. As an example of the polymer substrate, a film substrate such as polyethylene terephthalate, polycarbonate, polyimide, polyethylene naphthalate, and cycloolefin polymer may be used, but the present invention is not limited thereto.

Hereinafter, embodiments of the present invention will be described in more detail with reference to the Examples and Comparative Examples. However, the following Examples and Comparative Examples are only an example for describing the present invention in more detail, and do not limit the present invention in any way. Unless otherwise stated herein, the unit of a temperature is ° C., and unless otherwise stated, the unit of an amount of a composition used is wt %.

(Evaluation Method)

1. Evaluation of Etchability

In order to evaluate the etchability of the etching composition prepared in the following Examples and the Comparative Examples, a silicon nitride film ($Si_3N_4$) and a silicon oxide film ($SiO_2$) were alternately deposited 30 times on a wafer by a PECVD method, and patterning was performed by dry etching after a photolithography process, thereby manufacturing a 30-layer vertically laminated structure of patterned silicon nitride film/silicon oxide film (unit layer, 1 layer) (pattern wafer).

In addition, each of a silicon nitride film and a silicon oxide film was deposited on a silicon wafer using a LPCVD method to manufacture a blanket silicon nitride film wafer and a silicon oxide film wafer, respectively (blanket wafer).

100 ml of each etching composition prepared in the following Examples and Comparative Examples was prepared in a PTFE beaker at room temperature (25° C.). Each of the etching compositions and each wafer prepared were placed in a pressurizable reactor, and were subjected to an etching process at 5.5 atm, at 160° C. for 20 minutes. After completing the experiment, each wafer was washed with deionized water and dried using a nitrogen gas.

Evaluation of each of the 30-layer vertically laminated structures dried after the etching process was performed by measuring the thickness of silicon nitride film etched in a horizontal direction and the thickness of a remaining silicon oxide film. For reference, the thicknesses of the silicon nitride film and the silicon oxide film of a blanket wafer were measured using an ellipsometer (model name: MG-1000, manufacturer: Nano-View), and the etching rate was calculated by a thickness difference before and after the experiment. In addition, the selection ratio ($ER_{Si3N4}/ER_{SiO2}$) of the silicon nitride film to the silicon oxide film was calculated by the etching rate value obtained therefrom.

The results are shown in Table 1.

In addition, a section of the 30-layer vertically laminated structure of each etching example was measured by SEM, and the images are illustrated in the following FIGS. 2 to 12.

In addition, the silicon nitride film etching rate ($ER_{Si3N4}$) and the silicon oxide film etching rate ($ER_{SiO2}$) obtained in the silicon nitride film/silicon oxide film 30-layer vertically laminated structure, and the etching selection ratio ($ER_{Si3N4}/ER_{SiO2,o}$) determined by the ratio were determined by the method of FIG. 13. Specifically, the etching rate of the silicon nitride film ($ER_{Si3N4}$) in a horizontal direction in the silicon nitride film/silicon oxide film 30-layer vertically laminated structure was determined, and since it is difficult to determine the etching rate of the silicon oxide film in a horizontal direction, the silicon oxide film etching rate ($ER_{SiO2}$) in a vertical direction was determined from a change in the thickness of the silicon oxide film. In particular, since the outer thickness and the inner thickness of the silicon oxide film are often different, the silicon oxide film etching rate (outer $ER_{SiO2,o}$ and inner $ER_{SiO2,i}$) at two points were indicated, and a ratio of outer thickness to inner thickness was indicated. The representative etching selection ratio of the silicon nitride film/silicon oxide film was represented as a ratio of the etching rate of the inner silicon nitride film in a horizontal direction to the outer silicon oxide etching rate ($ER_{Si3N4}/ER_{SiO2,o}$)

The results are shown in Table 2.

Examples 1 to 6, and Comparative Examples 1 to 9

Mixing was performed at each composition ratio described below, and then stirring was performed at a speed of 500 rpm for 5 minutes to prepare an etching composition. The content of deionized water was a balance so that the total weight of the etching composition satisfied 100 wt %, thereby preparing 100 g of a silicon nitride film etching composition. Here, Comparative Examples 3 to 9 were performed under an atmospheric (normal pressure) condition, Example 3 was performed by shortening an etching process time of a pattern wafer to 5 minutes.

Example 1: deionized water+aminotris(methylenephosphonic acid) (25 wt %)

Example 2: deionized water+citric acid (16 wt %)

Example 3: deionized water+etidronic acid (17 wt %)

Example 4: deionized water+aminotris(methylenephosphonic acid) (12.5 wt %)+citric acid (8 wt %)

Example 5: deionized water+HCl (0.008 wt %)+HF (0.006 wt %)+silicic acid (0.1 wt %)+aminotris(methylenephosphonic acid) (25 wt %)

Example 6: deionized water+HCl (0.008 wt %)+HF (0.006 wt %)+aminotris(methylenephosphonic acid) (25 wt %)

Comparative Example 1: deionized water

Comparative Example 2: deionized water+HCl (0.008 wt %)+HF (0.006 wt %)+silicic acid (0.1 wt %)

Comparative Example 3: 85 wt % of phosphoric acid (normal pressure)

Comparative Example 4: deionized water+etidronic acid (60 wt %) (normal pressure)

Comparative Example 5: deionized water+aminotris(methylenephosphonic acid) (20 wt %) (normal pressure)

Comparative Example 6: deionized water+aminotris(methylenephosphonic acid) (50 wt %) (normal pressure)

Comparative Example 7: deionized water+citric acid (1 wt %)+HF (2.5 wt %)+NH4F (20 wt %) (normal pressure)

Comparative Example 8: deionized water+citric acid (3 wt %)+HF (2.5 wt %)+NH4F (20 wt %) (normal pressure)

Comparative Example 9: deionized water+citric acid (4.5 wt %)+HF (2.5 wt %)+NH4F (20 wt %) (normal pressure)

TABLE 1

| Classification | $ER_{Si3N4}$ (Å/min) | $ER_{SiO2}$ (Å/min) | Etching selection ratio |
| --- | --- | --- | --- |
| Example 1 | 74.4 | 1.1 | 67 |
| Example 2 | 46.6 | 1.0 | 47 |
| Example 3 | >148 | 2.14 | >69 |
| Example 4 | 62.8 | 1.36 | 46 |
| Example 5 | 54.5 | 0.07 | 779 |
| Comparative Example 1 | 23.2 | 1.5 | 16 |
| Comparative Example 2 | 28.4 | 0.6 | 48 |
| Comparative Example 3 | 58 | 15 | 3.9 |

As shown in Table 1, since the etching composition for pressurization according to embodiments of the present invention represented the etching rate of 46.6 Å/min or more and the etching selection ratio of 46 or more for the silicon nitride film, it was confirmed that trade-off between the etching rate and the etching selection ratio for the silicon nitride film was resolved to implement both in balance. However, in the Comparative Examples, trade-off between the etching rate and the etching selection ratio for the silicon nitride film was not appropriately resolved, and in particular, in Comparative Example 3 using only phosphoric acid, the etching rate for the silicon oxide film was very high.

TABLE 2

| Classification | Silicon nitride film etching rate ($ER_{Si3N4}$, Å/min) | Silicon oxide film outer etching rate ($ER_{SiO2,o}$, Å/min) | Silicon oxide film inner etching rate ($ER_{SiO2,i}$, Å/min) | Ratio of outer thickness to inner thickness of silicon oxide film ($T_o/T_i$, $T'_o/T'_i$) | Representative etching selection ratio ($ER_{Si3N4}/ER_{SiO2,o}$) |
| --- | --- | --- | --- | --- | --- |
| Example 2 | 43.5 | 0.10 | 0 | 0.99 | 435 |
| Example 3 | 675.7 | 6.99 | 1.71 | 0.91 | 97 |
| Example 4 | 56.5 | 0.30 | 0.13 | 0.98 | 188 |
| Example 6 | 115.5 | 0.24 | 0 | 0.97 | 482 |
| Comparative Example 1 | 71.0 | 8.35 | 0.18 | 0.45 | 9 |
| Comparative Example 3 | 188 | 4.33 | 0.33 | 0.59 | 43 |

As shown in Table 2, it was confirmed that the etching composition for pressurization according to embodiments of the present invention may implement more significant etching characteristics in the vertically laminated structure. Specifically, it was confirmed that according to embodiments of the present invention, the etching selection ratio of 97 or more may be implemented and the etching rate for the silicon nitride film up to 675.7 Å/min may be implemented.

Figure 2:
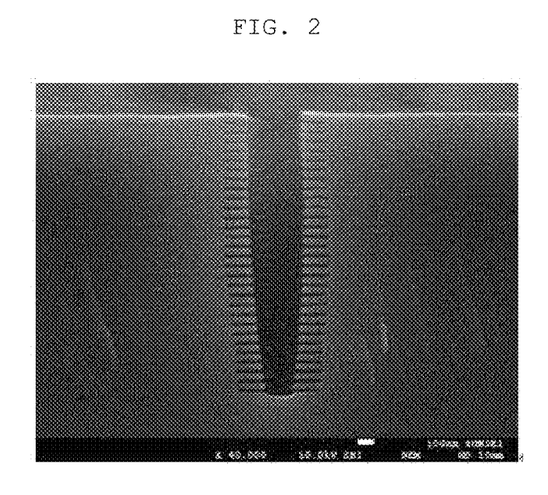
FIG. 2 illustrates an etching example in a vertically laminated structure according to embodiments of the present invention (Example 1, scale bar 100 □).
Figure 3:
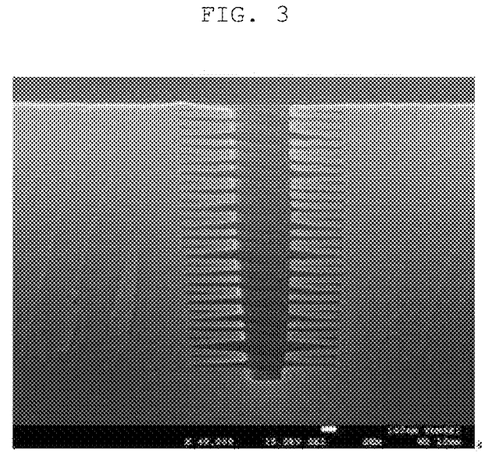
FIG. 3 illustrates an etching example in the vertically laminated structure according to embodiments of the present invention (Example 3, scale bar 100 □).
Figure 4:
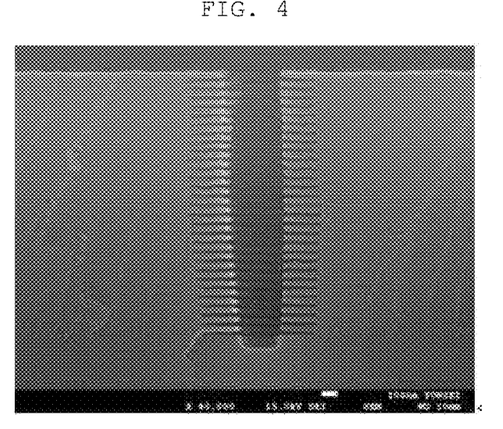
FIG. 4 illustrates an etching example in the vertically laminated structure according to embodiments of the present invention (Example 6, scale bar 100 □).
Figure 5:
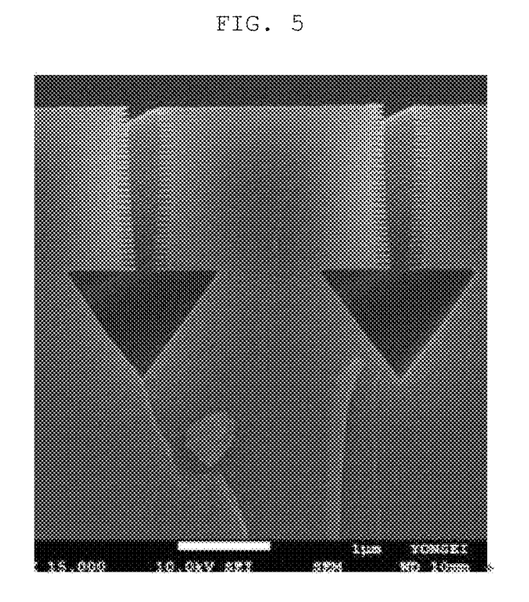
FIG. 5 illustrates an etching example in the vertically laminated structure according to embodiments of the present invention (Comparative Example 1, scale bar 1 □).

In addition, as a result of comparing the etching selection ratios in the vertically laminated structure in which the silicon nitride film and the silicon oxide film were repeatedly laminated, it was confirmed that when the etching process was performed using the etching composition for pressurization according to embodiments of the present invention, more stable etching was possible (see FIGS. 2 to 4). However, as shown in Table 2 and the following FIG. 5, in Comparative Example 1, the ratio of outer thickness to inner thickness ($T_o/T_i$) of the silicon oxide film of 0.45 and the etching selection ratio of the silicon nitride film and the silicon oxide film of 9 were obtained, and it was observed that the thickness of the silicon oxide film was unevenly thin. In addition, etching of a silicone substrate was confirmed.

Figure 6:
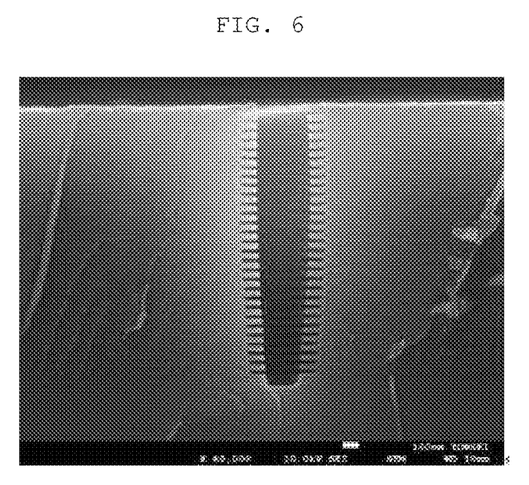
FIG. 6 illustrates an etching example in the vertically laminated structure according to embodiments of the present invention (Comparative Example 2, scale bar 100 □).
Figure 7:
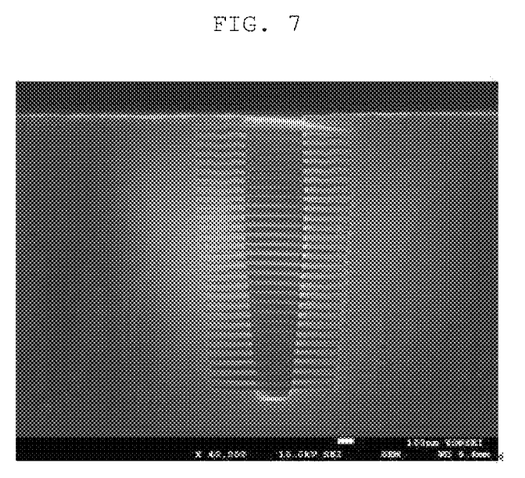
FIG. 7 illustrates an etching example in the vertically laminated structure according to embodiments of the present invention (Comparative Example 3, scale bar 100 □).

In addition, as shown in Table 2 and the following FIG. 6, in Comparative Example 2, it was confirmed that the etching rate for the silicon nitride film was significantly low. In addition, as shown in Table 2 and the following FIG. 7, in Comparative Example 3, the ratio of outer thickness to inner thickness ($T_o/T_i$) of the silicon oxide film was 0.59 and the representative etching selection ratio ($ER_{Si3N4}/ER_{SiO2,o}$) was only 43.

In addition, in Comparative Example 4, an etching process was performed under a normal pressure condition, and the composition was hardened on the surface of the wafer during the etching process to lower the function as the etching solution.

Figure 8:
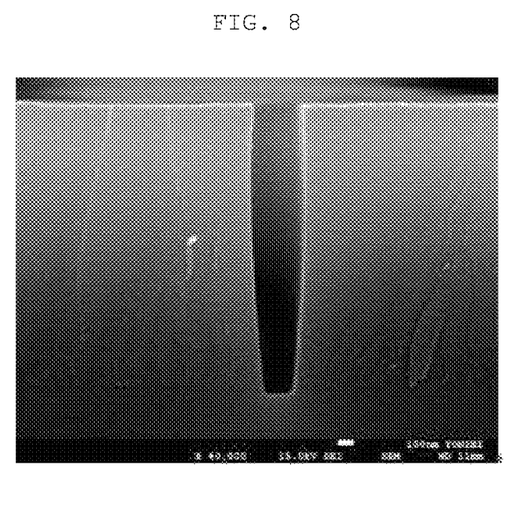
FIG. 8 illustrates an etching example in the vertically laminated structure according to embodiments of the present invention (Comparative Example 5, scale bar 100 □).
Figure 9:
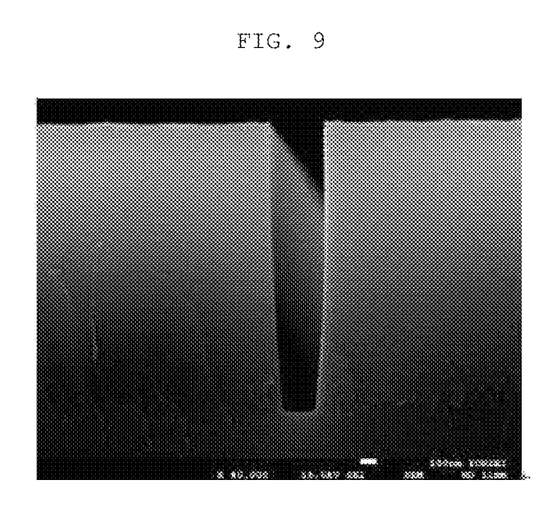
FIG. 9 illustrates an etching example in the vertically laminated structure according to embodiments of the present invention (Comparative Example 6, scale bar 100 □).
Figure 10:
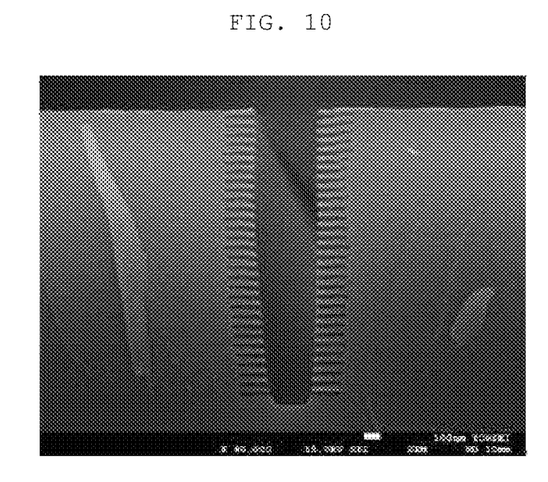
FIG. 10 illustrates an etching example in the vertically laminated structure according to embodiments of the present invention (Comparative Example 7, scale bar 100 □).
Figure 11:
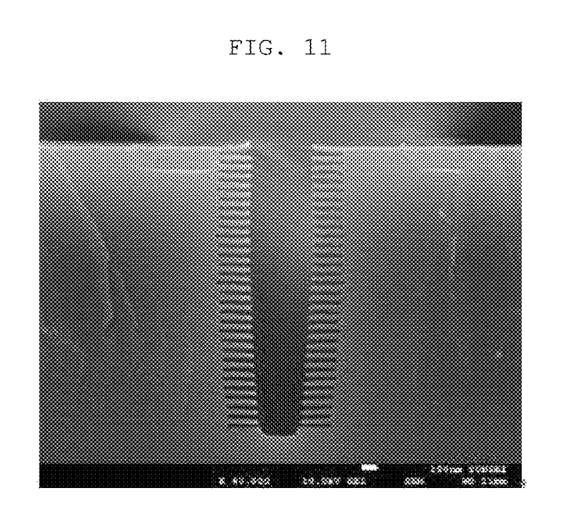
FIG. 11 illustrates an etching example in the vertically laminated structure according to embodiments of the present invention (Comparative Example 8, scale bar 100 □).
Figure 12:
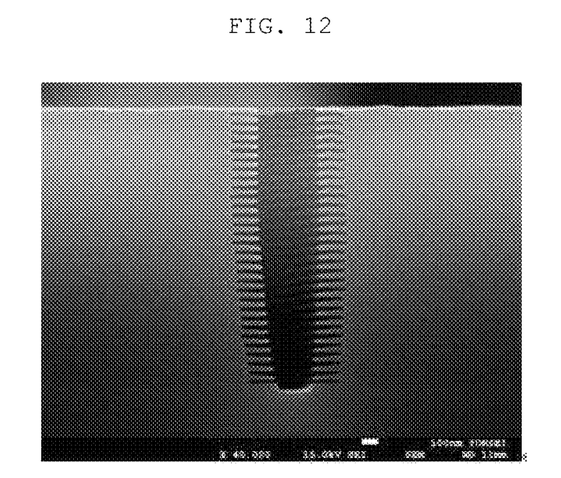
FIG. 12 illustrates an etching example in the vertically laminated structure according to embodiments of the present invention (Comparative Example 9, scale bar 100 □).

In addition, as shown in the following FIGS. 8 and 9, in Comparative Examples 5 and 6, the etching process was performed under a normal pressure condition, and visible etching was not performed both in the silicon nitride film and the silicon oxide film. In addition, as shown in the following FIGS. 10 to 12, in Comparative Examples 7 to 9, the silicon oxide film, not the silicon nitride film, was reversely etched. That is, Comparative Examples 7 to 9 were etching compositions which selectively etched the silicon oxide film, unlike the etching composition for pressurization according to embodiments of the present invention.

Meanwhile, as a result of comparing the ratios of outer thickness to inner thickness ($T_o/T_i$) of the etched silicon oxide films, as shown in Table 2 and the following FIGS. 2 to 4, it was confirmed that the etching composition for pressurization according to embodiments of the present invention had the ratios of outer thickness to inner thickness ($T_o/T_i$) of the silicon oxide film of 0.98 (Example 1), 0.91 (Example 3), and 0.97 (Example 6). In addition, it was confirmed that the representative etching selection ratio ($ER_{Si3N4}/ER_{SiO2,o}$) was 97 to 435. In particular, in Example 3, both the silicon nitride film etching rate and the etching selection ratio were increased as compared with Comparative Example 3 using phosphoric acid, and a trade-off relationship was resolved to implement both in balance. From the numerical values, it is seen that when the etching process was performed using the etching composition for pressurization according to embodiments of the present invention, occurrence of abnormal growth in the silicon oxide film was suppressed even in the vertically laminated structure, so that stable etching was possible.

From the results as such, it is seen that the etching composition for pressurization according to embodiments of the present invention may etch the silicon nitride film very stably though the composition is a non-phosphoric acid-based etching composition using no phosphoric acid. Also, in terms of confirming that not only significantly improved etchability may be implemented by the pressurization process but also the subject to be etched varies depending on whether the pressurization process is performed even with the etching compositions of the same composition, embodiments of the present invention are distinguished from the related technology. In addition, according to embodiments of the present invention, damage of the film quality of the silicon oxide film is minimized and also occurrence of abnormal growth is completely prevented even in the etching process in a vertically laminated structure, and thus, stability and reliability of the process may be secured.

Therefore, the etching composition for pressurization according to embodiments of the present invention may allow stable selective etching of a silicon nitride film while preventing deterioration of electrical properties and occurrence of abnormal growth due to overetching of the silicon oxide film or damage of the film quality of the silicon oxide film, thereby improving the semiconductor device characteristics.

The etching composition according to embodiments of the present invention may effectively suppress etching of a silicon oxide film, despite including no phosphoric acid, and may implement a high selection ratio of a silicon nitride film to a silicon oxide film. In particular, the etching composition according to embodiments of the present invention may stably exert effective etchability even in a V-NAND structure.

The etching composition according to embodiments of the present invention does not use a weakly acidic phosphoric acid, and thus, is very safe in the handling thereof, which acts as a commercially very advantageous merit. In addition, the etching composition according to embodiments of the present invention may resolve a trade-off relationship between an etching rate and a selectivity ratio to implement both in balance, and thus, may reduce production costs of a semiconductor and significantly improve productivity.

The etching composition according to embodiments of the present invention stably etches a silicon nitride film without a chemical liquid change, while preventing a side reaction to prevent damage of silicon oxide film quality or deterioration of electrical properties due to occurrence of abnormal growth of a silicon oxide film during silicon nitride film etching, thereby preventing deterioration of semiconductor device characteristics to provide a highly reliable semiconductor device.

As described above, as a semiconductor integration degree is improved, according to a recent trend in which selective etching in a micropattern structure becomes important, the etching composition according to embodiments of the present invention may provide more advantageous merits from various viewpoints than a related phosphorus acid process technology.

It will be apparent to those skilled in the art to which the present invention pertains that the present invention described above is not limited to the above-mentioned example embodiments, but is variously substituted, modified, and altered without departing from the scope and spirit of the present invention.

What is claimed is:

1. An etching method comprising: selectively etching a silicon nitride film rather than a silicon oxide film under a pressurization condition, using the an etching composition comprising:
   an organic acid-based chelating agent including an organic phosphonic acid group, a carboxylic acid group, or a combination thereof, wherein the composition satisfies the following (A) to (C):
   (A) includes 10 to 50 wt % of the organic acid-based chelating agent and a balance of water based on a total weight of the etching composition,
   (B) has an etching rate of the silicon nitride film of 35 A/min or more, and
   (C) has an etching selection ratio of the silicon nitride film to the silicon oxide film of 40 or more.

2. The etching method of claim 1, wherein a subject to be etched of the etching composition is
   a wafer in which both the silicon oxide film and the silicon nitride film are exposed to a surface; or
   a wafer having a lamination structure having the silicon oxide film and the silicon nitride film as a unit layer.

3. The etching method of claim 1, wherein the pressurization condition is performed at 2 to 220 atm.

4. The etching method of claim 1, wherein the etching method is for etching at a high temperature of 100° C. or higher.

5. A method of manufacturing a semiconductor device, comprising the etching method of claim 1.

6. The etching method of claim 1, wherein the organic acid-based chelating agent is one or two or more selected from citric acid, tartaric acid, ethylenediaminetetraacetic acid, diethylenetriaminepentaacetic acid, N-(hydroxyethyl)ethylenediaminetriacetic acid, nitrilotriacetic acid, ethylenediaminedisuccinic acid, and salts thereof.

7. The etching method of claim 1, wherein the organic acid-based chelating agent is one or two or more selected from ethylenediaminetetra(methylenephosphonic acid), aminotris(methylenephosphonic acid), diethylenetriaminepenta(methylenephosphonic acid), etidronic acid, and salts thereof.

8. The etching method of claim 1, wherein the organic acid-based chelating agent is one or two or more selected from phosphonobutane-3-carboxylic acid, N-(phosphonomethyl)iminodiacetic acid, 2-carboxyethylphosphonic acid, 2-hydroxyphosphonoacetic acid, and salts thereof.

9. The etching method of claim 1, wherein the composition satisfies the following (D):
   (D) having an outer thickness ($T_O$) relative to an inner thickness ($T_i$) of the silicon oxide film satisfying the following Equation 1, in a vertically laminated structure having the silicon oxide film and the silicon nitride film as a unit layer:

$1.0 \geq T_o/T_i \geq 0.89.$ [Equation 1]

10. The etching method of claim 1, wherein the composition further comprising: a hydroxide, a fluorine-based compound, or a combination thereof.

11. The etching method of claim 10, wherein the composition further comprising:
   an inorganic acid selected from hydrochloric acid, nitric acid, sulfuric acid, and boric acid; and
   a silicon-based compound represented by the following Chemical Formula 1:

[Chemical Formula 1]

wherein
   $R_1$ to $R_4$ are independently of one another hydrogen, hydroxy, C1-C20 alkyl, C1-C20 aminoalkyl, C1-C20 alkoxy, C1-C20 acetyloxy, or C1-C20 haloalkylacetyloxy.

12. The etching method of claim 11, wherein the composition satisfies the following (A') to (D'):
   (A') including 10 to 50 wt % of the organic acid-based chelating agent and a balance of water,
   (B') having the etching rate of the silicon nitride film of 40 Å/min or more,
   (C') having the etching selection ratio of the silicon nitride film to the silicon oxide film of 400 or more, and
   (D') having the outer thickness ($T'_o$) relative to the inner thickness ($T'_i$) of the silicon oxide film satisfying the following Equation 2, in a vertically laminated structure having the silicon oxide film and the silicon nitride film as a unit layer:

$1.0 \geq T'o/T'i \geq 0.89.$ [Equation 2]

13. The etching method of claim 1, wherein the etching composition is non-phosphoric acid-based.

* * * * *